(12) United States Patent
Shu et al.

(10) Patent No.: US 11,265,009 B2
(45) Date of Patent: Mar. 1, 2022

(54) WAVEFORM SYNTHESIZER USING MULTIPLE DIGITAL-TO-ANALOG CONVERTERS

(71) Applicant: TEXAS INSTRUMENTS INCORPORATED, Dallas, TX (US)

(72) Inventors: Keliu Shu, Frisco, TX (US); Gary Franklin Chard, Murphy, TX (US); William Robert Krenik, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/730,612

(22) Filed: Dec. 30, 2019

(65) Prior Publication Data

US 2020/0382131 A1   Dec. 3, 2020

Related U.S. Application Data

(60) Provisional application No. 62/854,622, filed on May 30, 2019.

(51) Int. Cl.
*H03M 1/00* (2006.01)
*H03M 1/66* (2006.01)
(Continued)

(52) U.S. Cl.
CPC ............ *H03M 1/66* (2013.01); *G06F 1/0321* (2013.01); *H03M 1/0697* (2013.01)

(58) Field of Classification Search
CPC .... H03M 1/1215; H03M 1/121; H03M 1/662; H03M 1/0673; H03M 3/468; H03M 1/66;
(Continued)

(56) References Cited

U.S. PATENT DOCUMENTS 6,721,379 B1 * 4/2004 Cranford, Jr. ........ H03K 3/0322
327/149
6,822,595 B1 * 11/2004 Robinson ................ H03M 3/51
341/143
(Continued)

FOREIGN PATENT DOCUMENTS

EP   3217556 B1   1/2019

OTHER PUBLICATIONS

Search Report for PCT Application No. PCT/US20/35085, date of mailing of international search report dated Aug. 20, 2020, 2 pages.

*Primary Examiner* — Linh V Nguyen
(74) *Attorney, Agent, or Firm* — Valerie M. Davis; Charles A. Brill; Frank D. Cimino (57) ABSTRACT

A circuit includes a phase-locked loop having a phase-locked loop output to provide a first phase signal and a second phase signal phase delayed with respect to the first phase signal. The circuit further includes a digital circuit having a digital circuit input and an output. The digital circuit input couples to the phase-locked loop output. On the digital circuit output, the digital circuit is configured to provide a first digital-to-analog converter (DAC) enable signal and a second DAC enable signal. The circuit also includes first and second DACs. The first DAC is coupled to the digital circuit. The first DAC has a first enable input coupled to the digital circuit output to receive the first DAC enable signal. The second DAC is coupled to the digital circuit. The second DAC has a second enable input coupled to the digital circuit output to receive the second DAC enable signal.

26 Claims, 12 Drawing Sheets

(51) Int. Cl.
*H03M 1/06* (2006.01)
*G06F 1/03* (2006.01)

(58) Field of Classification Search
CPC ........ H03M 3/358; H03M 3/38; H03M 3/466; H03M 13/27; H03K 19/017581; H04B 10/503; H04B 10/66; H04B 10/676; H04L 7/0091
USPC .......................................... 341/139–142, 144
See application file for complete search history.

(56) References Cited

U.S. PATENT DOCUMENTS

| | | | | |
|---|---|---|---|---|
| 6,925,130 | B2* | 8/2005 | Chan | H04B 15/00 341/144 |
| 7,253,760 | B2* | 8/2007 | Yamashita | H03M 1/0624 341/144 |
| 7,622,966 | B2 | 11/2009 | Werker | |
| 7,994,828 | B2* | 8/2011 | Kao | H03K 21/023 327/115 |
| 9,461,655 | B2* | 10/2016 | Boecker | H03K 5/131 |
| 2001/0026179 | A1* | 10/2001 | Saeki | H03K 5/135 327/147 |
| 2002/0009170 | A1* | 1/2002 | Schmatz | H04L 27/152 375/371 |
| 2003/0185327 | A1* | 10/2003 | Chen | H03L 7/0996 375/371 |
| 2005/0123029 | A1* | 6/2005 | Vorenkamp | H04L 5/06 375/222 |
| 2006/0098823 | A1* | 5/2006 | Venes | H04N 7/17309 380/219 |
| 2007/0047689 | A1 | 3/2007 | Menolfi et al. | |
| 2008/0165040 | A1* | 7/2008 | Rotchford | H03M 1/1047 341/120 |
| 2009/0052556 | A1* | 2/2009 | Fernandez | H03M 1/662 375/241 |
| 2011/0254487 | A1 | 10/2011 | Clothier et al. | |
| 2015/0222273 | A1* | 8/2015 | Allan | H03L 7/143 327/157 |
| 2015/0341042 | A1* | 11/2015 | Balachandran | H03L 7/093 327/156 |
| 2016/0301898 | A1* | 10/2016 | Asada | H04N 9/3182 |

* cited by examiner

WAVEFORM SYNTHESIZER USING MULTIPLE DIGITAL-TO-ANALOG CONVERTERS

CROSS-REFERENCE TO RELATED APPLICATIONS

This application claims priority to U.S. Provisional Application No. 62/854,622, filed May 30, 2019, which is hereby incorporated by reference.

BACKGROUND

Many applications use a periodic electrical waveform for theft operation. Examples of waveforms include sine and triangular patterns. Examples of use of such waveforms include time-of-flight (TOF) transmitters and harmonic rejection mixers (HRM).

SUMMARY

In one example, a circuit includes a phase-locked loop having a phase-locked loop output configured to provide a first phase signal and a second phase signal, the second phase signal phase delayed with respect to the first phase signal. The circuit further includes a digital circuit having a digital circuit input and a digital circuit output. The digital circuit input is coupled to the phase-locked loop output. On the digital circuit output, the digital circuit is configured to provide a first digital-to-analog converter (DAC) enable signal and a second DAC enable signal. The circuit also includes first and second DACs. The first DAC is coupled to the digital circuit. The first DAC has a first enable input coupled to the digital circuit output to receive the first DAC enable signal. The second DAC is coupled to the digital circuit. The second DAC has a second enable input coupled to the digital circuit output to receive the second DAC enable signal.

BRIEF DESCRIPTION OF THE DRAWINGS

For a detailed description of various examples, reference will now be made to the accompanying drawings in which.

DETAILED DESCRIPTION

Figure 1A:
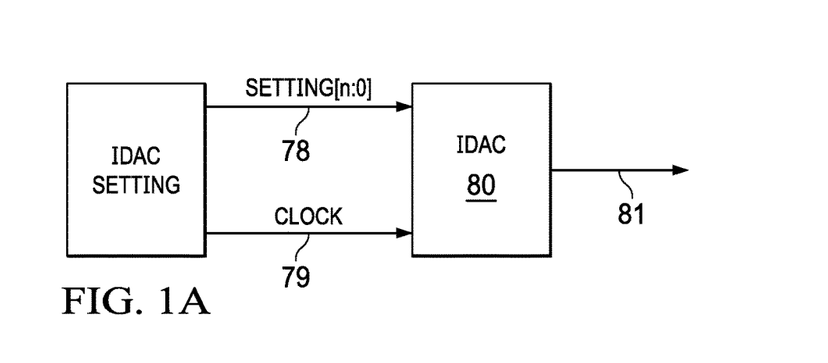
FIG. 1A illustrates an example of a current digital-to-analog converter (IDAC) to synthesize a periodic waveform.

FIG. 1A shows an example implementation for simulating a periodic waveform. In this example, a current digital-to-analog converter (IDAC) 80 generates an analog output current 81 at various levels based on a digital code (SETTING[n:0]) 78. If n is 2, then the digital code 78 is a 3-bit code and the IDAC 80 therefore can produce 8 different levels of analog current. A clock signal 79 is provided to clock the IDAC 80. For example, upon each rising edge of the clock signal 79, the IDAC 80 produces an output current 81 corresponding to the value of the digital code 78.

Figure 1B:
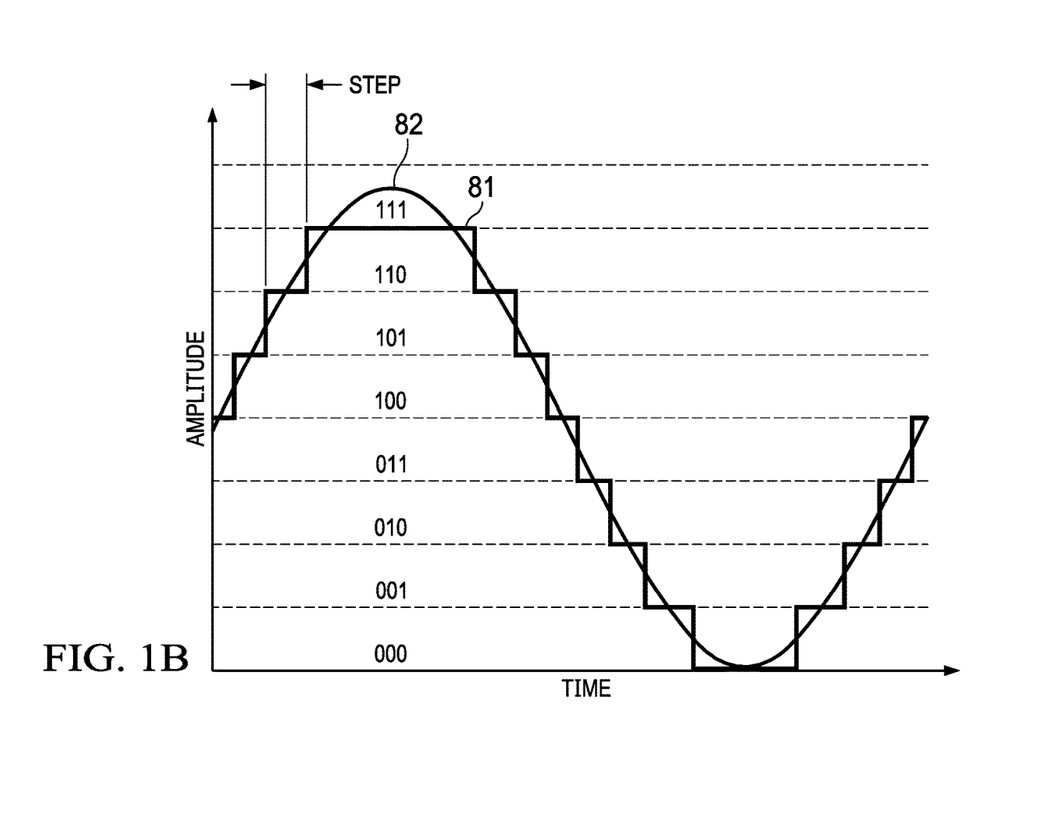
FIG. 1B is an example of a synthesized waveform.

FIG. 1B illustrates the use of the IDAC 80 of FIG. 1A to simulate a sinewave 81. In this example, the IDAC 80 is a 3-bit IDAC capable of generating eight different current levels based on eight different digital code inputs (000 through 111) as shown. With eight possible current levels (steps), the output current 81 has a stairstep appearance as shown. In the example shown, a single cycle of the sinewave 81 is simulated with 15 different steps as shown. At higher resolutions of the IDAC 80 (e.g., 8-bits, 16-bits, etc.), the output current 81 from the IDAC more closely matches a sinusoid.

The frequency with which the IDAC 80 is clocked by clock 79 in the example of FIG. 1A is higher than the frequency of the sinusoid being simulated. For example, for 15 steps per cycle and for a 300 MHz sinusoid to be simulated, the IDAC 80 is clocked at 15×300 MHz=4.5 GHz. Thus, as the frequency of the periodic waveform to be simulated increases, the frequency with which the IDAC 80 is clocked may very high thereby resulting in a large, expensive implementation.

Figure 2:
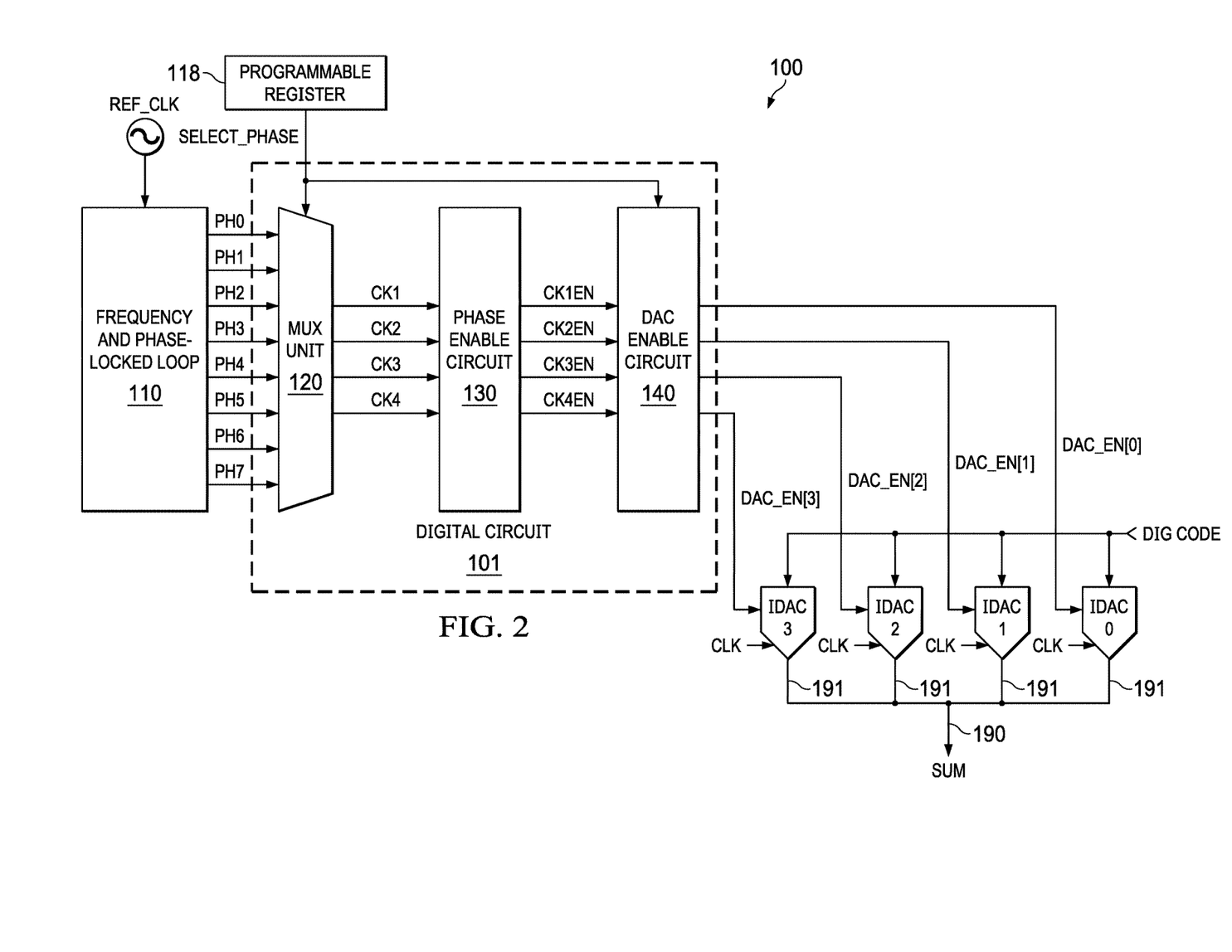
FIG. 2 shows an example of a waveform synthesizer including multiple IDACs.

FIG. 2 shows an example of a waveform synthesizer 100 that solves the problem of having to clock one IDAC at a frequency that is much larger than the frequency of the waveform to be simulated. In the example of FIG. 2, circuit 200 includes multiple IDACs with each IDAC being clocked at the frequency of the periodic waveform to be simulated, and thus at a lower frequency than was the case when using a single IDAC as in FIG. 1A.

In FIG. 2, the circuit 100 includes a frequency and phase-locked loop (FPLL) 110, a digital circuit 101, and four IDACs (IDAC0, IDAC1, IDAC2, and IDAC3). While four IDACs are shown in this example, other examples may have a different number of IDACs (e.g., two IDACs, three IDACs, eight IDACs, 16 IDACs, etc.). The outputs of the IDACs are coupled together to produce an output SUM signal 190. SUM 190 is a current whose magnitude is equal to the sum of the currents from the individual IDACs that are enabled at any given point in time. The digital circuit 101 includes a multiplexer unit 120, a phase enable circuit 130, and a digital-to-analog converter (DAC) enable circuit 140.

A reference clock (REF_CLK) is coupled to the FPLL 110. The FPLL 110 generates multiple output clocks referred to as "phases" herein. In this example, the FPLL 110 produces eight phases labeled PH0-PH7. The eight phases are provided to corresponding inputs of multiplexer unit 120. The multiplexer unit 120 receives a control signal (SELECT_PHASE) signal from a programmable register 118. In response to SELECT_PHASE, the multiplexer unit 120 generates four output clocks (CLK1-CLK4). Each clock CLK1-CLK4 is one of the eight input phases (PH0-PH7). CLK1 is selected to be a different phase than CLK2, CLK2 is selected to be a different phase than CLK3, and CLK3 is selected to be a different phase than CLK4. A different one of the eight phases PH0-PH7 is used to provide each of CLK1, CLK2, CLK3, and CLK4, as will be described below.

The inputs of the phase enable circuit 130 are coupled to the outputs of the multiplexer unit 120, and thus the phase enable circuit 130 receives CLK1-CLK4. The phase enable circuit 130 uses the CLK1-CLK4 signals to generate clock enable signals (CLK1EN-CLK4EN) to the DAC enable circuit 140. The DAC enable circuit 140 receives the CLK1EN-CLK4EN signals and uses those signals to generate a separate enable signal DAC_EN to each of the IDACs. The DAC enable circuit 140 generates DAC_EN[0], DAC_EN[1], DAC_EN[2], and DAC_EN[3] for each IDAC0-IDAC3, respectively, as shown. A digital code (DIG CODE) is provided to the digital input of each IDAC, and thus each IDAC is configured to generate the same output current as the other IDACs. The outputs 191 of the IDACs are connected together, and thus the output currents are summed together from whichever IDACs are enabled at any given time to produce SUM 190. By sequencing when each IDAC is enabled, a multi-step waveform can be created to simulate a periodic waveform.

Figure 3:
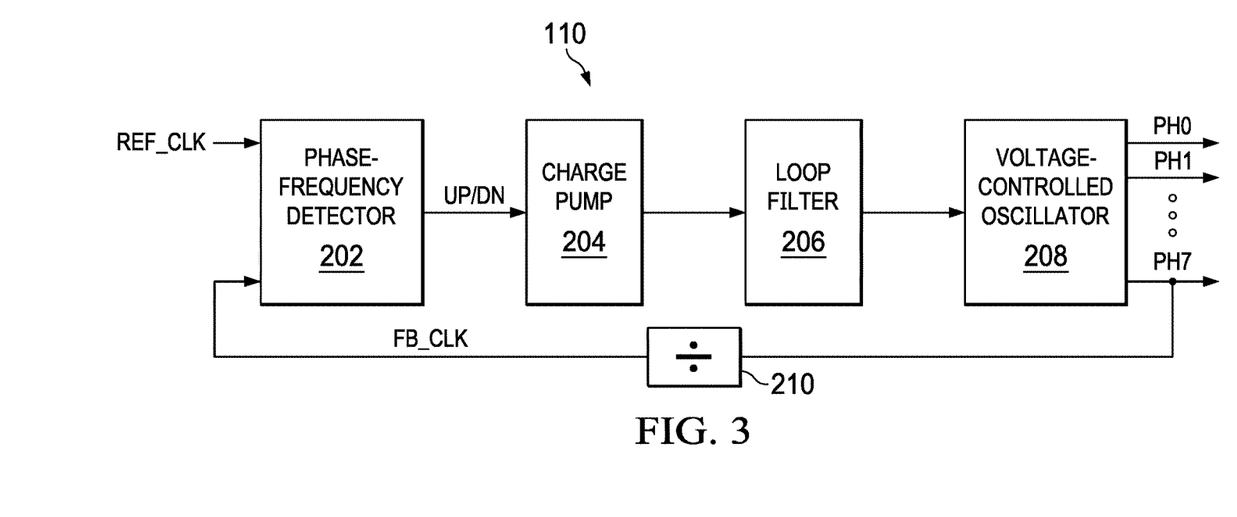
FIG. 3 shows an example of a frequency and phase-locked loop usable within the example of FIG. 2.

FIG. 3 shows an example of the FPLL 110 of FIG. 2. In the example of FIG. 3, FPLL 110 includes a phase-frequency detector (PFD) 202, a charge pump 204, a loop filter 206, a voltage-controlled oscillator (VCO) 208, and a frequency divider 210. One input of the PFD 202 receives REF_CLK and another input of the PFD 202 receives a feedback clock (FB_CLK) form from the frequency divider 210. The output of the of the PFD 202 includes up (UP) and down (DN) signals which indicate whether the REF_CLK is leading or lagging the FB_CLK. The UP/DN signals are provided to the charge pump 204 which generates a signal based on the state of the UP/DN signals. The signal from the charge pump 204 is filtered by the loop filter 206 to thereby provide a voltage to the VCO 208. The VCO generates the phase signals PH0-PH7, the frequency of which are controlled by the VCO 208 based on its input voltage from the loop filter 206. One of the phase signals (e.g., PH7) is provided to an input of the frequency divider 210. The frequency of the phase signals may be higher than the REF_CLK and the frequency divider 210 divides down the phase frequency to produce the FB_CLK of approximately the same frequency as REF_CLK.

Figure 4:
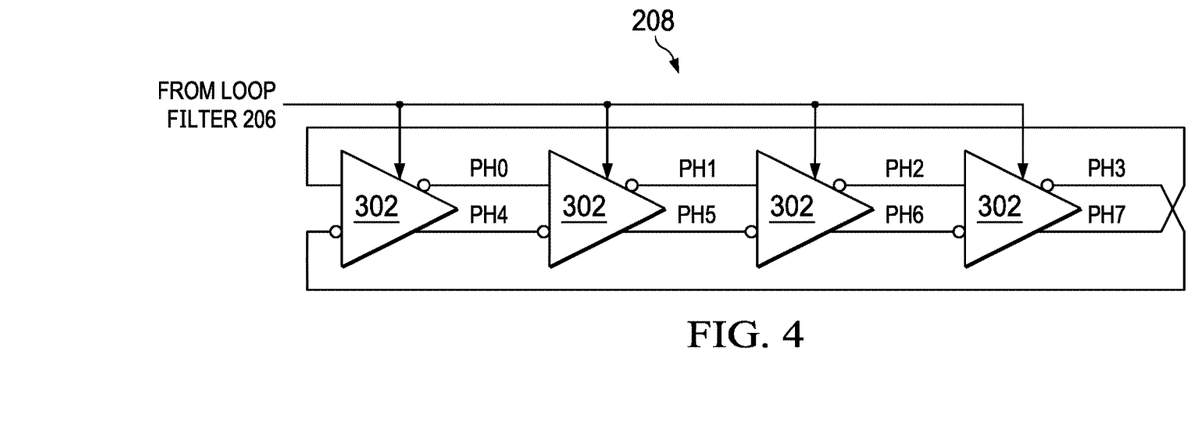
FIG. 4 shows an example of a ring oscillator used in the frequency and phase-locked loop of FIG. 3 to generate multiple phase signals.

FIG. 4 shows an example implementation of the VCO 208. In this example, the VCO 208 comprises ring oscillator comprising multiple differential inverters 302 connected in series in a ring configuration as shown. The number of differential inverters 302 may be an even number which causes the ring oscillator to be unstable. The positive and negative outputs of each inverter 302 toggles between logic low (0) and logic high (1) at a frequency that is a function of the number of inverters and the power supply voltage (provided by the loop filter 206) to the inverters. Some, or all, of the connection points (taps) between the differential inverters 302 are used as the phase signals as shown.

Figure 5:
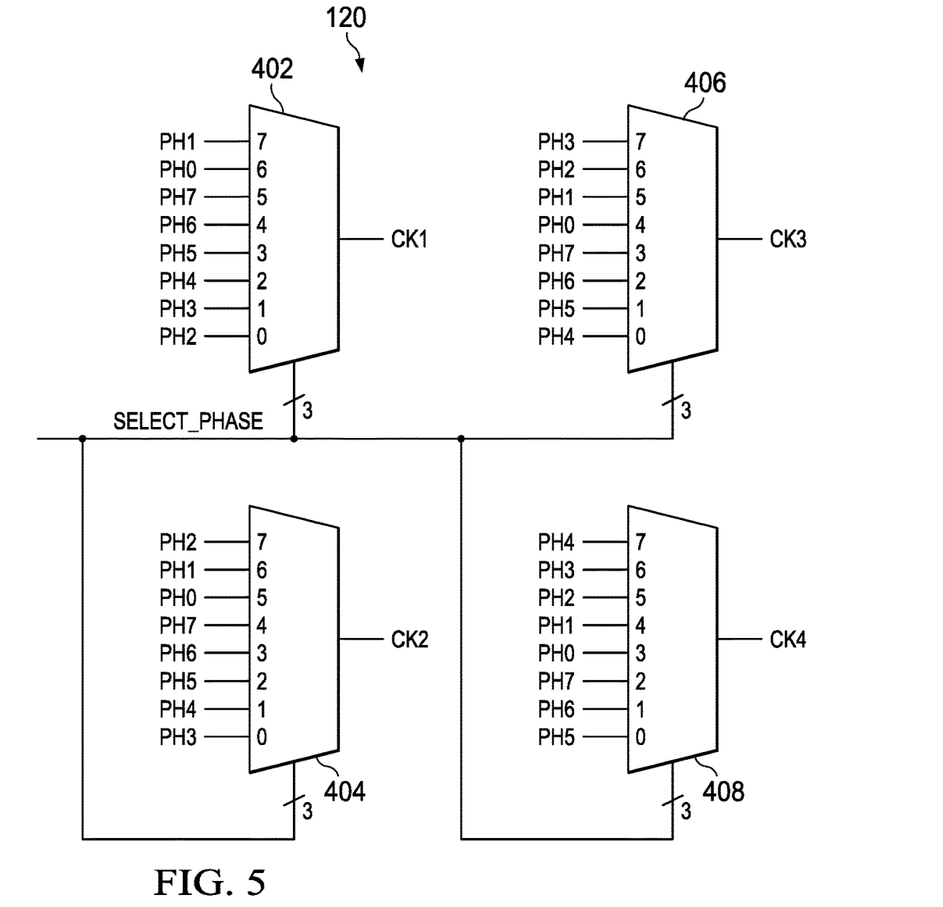
FIG. 5 shows an example of a multiplexer for use in the waveform synthesizer of FIG. 2.

FIG. 5 shows an example of multiplexer unit 120. Multiplexer unit 120 comprises four multiplexers 402, 404, 406, and 408. Each multiplexer 402-408 includes inputs labeled 0 through 7 coupled to receive all of the phase signals PH0-PH7. The phase signals are coupled to different inputs between the multiplexers 402-408. For example, for multiplexer 402, PH0 and PH1 are coupled to inputs 6 and 7 and PH2-P7 are coupled to inputs 0 through 5, respectively. For multiplexer 404, PH0, PH1, and PH2 are coupled to inputs 5-7, respectively, and PH3-P7 are coupled to inputs 0 through 4, respectively. For multiplexer 406, PH0-PH3 are coupled to inputs 4-7, respectively, and PH4-P7 are coupled to inputs 0 through 3, respectively. For multiplexer 408, PH0-PH4 are coupled to inputs 3-7, respectively, and PH5-P7 are coupled to inputs 0 through 2, respectively.

The selection signal (SELECT_PHASE) is coupled to the selection input of all four multiplexers 402-408, and thus the output of each multiplexer 402-408 represents the phase signal on the same multiplexer input. For example, for SELECT_PHASE equal to <000>, the phase signal on the 0-input of each multiplexer 402-408 is provided as that multiplexer's output signal. The output signals of the multiplexers 402-408 comprise CK1-CK4, respectively. With SELECT_PHASE being equal to <000>, CK1 is PH2, CK2 is PH3, CK3 is PH4, and CK4 is PH5.

Figure 6:
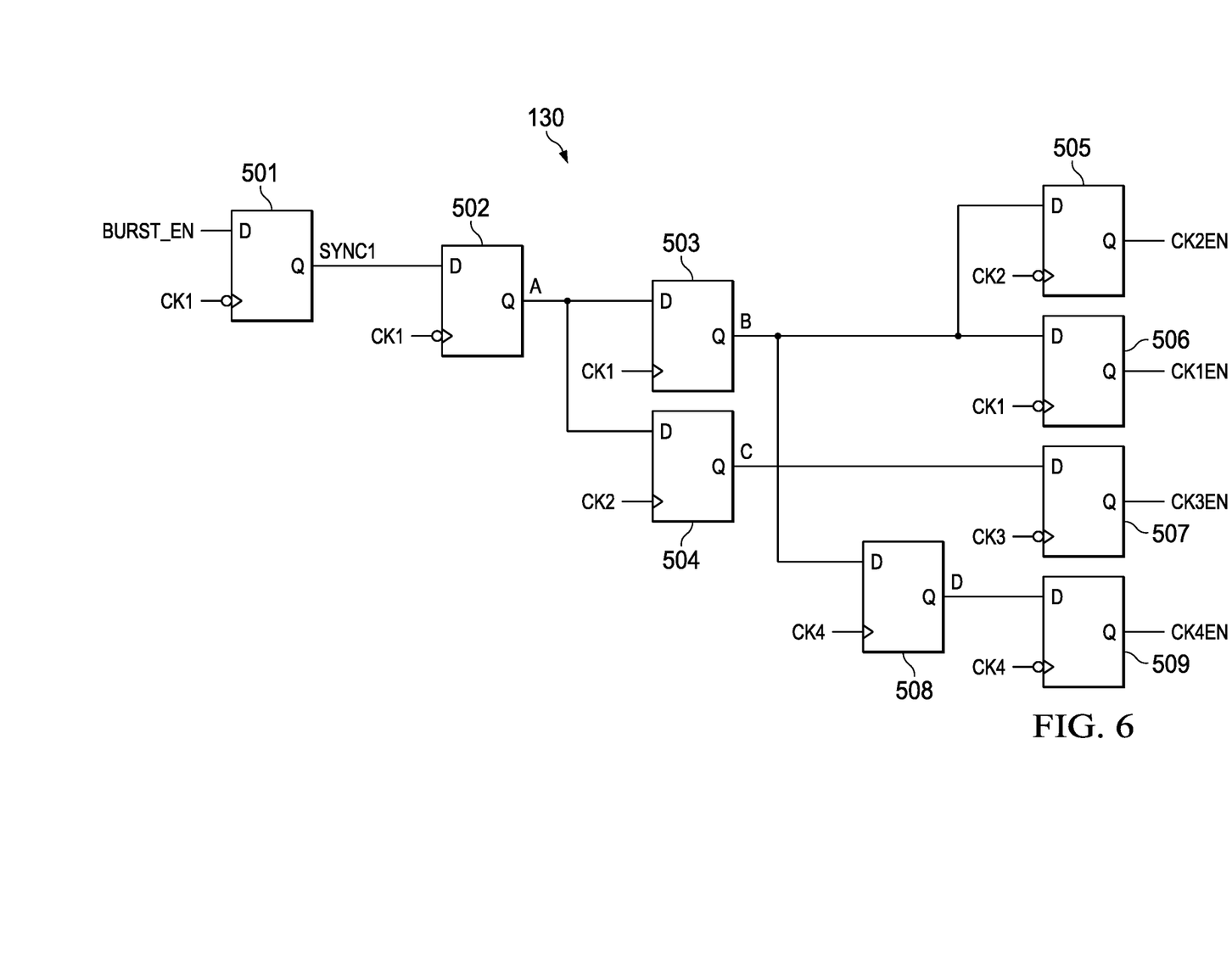
FIG. 6 shows an example of a phase enable circuit for use in the waveform synthesizer of FIG. 2.

FIG. 6 shows an example of phase enable circuit 130. Phase enable circuit 130 in this example includes latches 501 through 509. Each latch includes a data (D) input, a clock input, and an output (Q). The clock inputs of latches 501, 502, 505-507, and 509 are inverted (i.e., the latch latches in the D input on a falling edge of its clock input), and the clock inputs of latches 503, 504, and 508 are positive (i.e., data is latched on a rising edge of their clock inputs). CK1 is provided to the clock inputs of latches 501-503 and 506. CK2 is provided to the clock inputs of latches 504 and 505. CK3 is provided to the clock input of latch 507, and CK4 is provided to the clock inputs of latches 508 and 509.

The D input of latch 501 receives a BURST_EN signal. BURST_EN is a control signal that is input to the chip containing the waveform synthesizer 100. The output signal of latch 501 is SYNC1 and the Q output of latch 501 is coupled to the D input of latch 502. The output signal of latch 502 is A, and the Q output of latch 502 is coupled to the D inputs of latches 503 and 504. The output signal of latch 503 is B, and the Q output of latch 503 is coupled to the D inputs of latches 505, 506, and 508. The output signal of latch 504 is C, and the Q output of latch 504 is coupled to the D input of latch 507. Finally, the output signal of latch 508 is D, and the Q output of latch 508 is coupled to the D input of latch 509.

Figure 8:
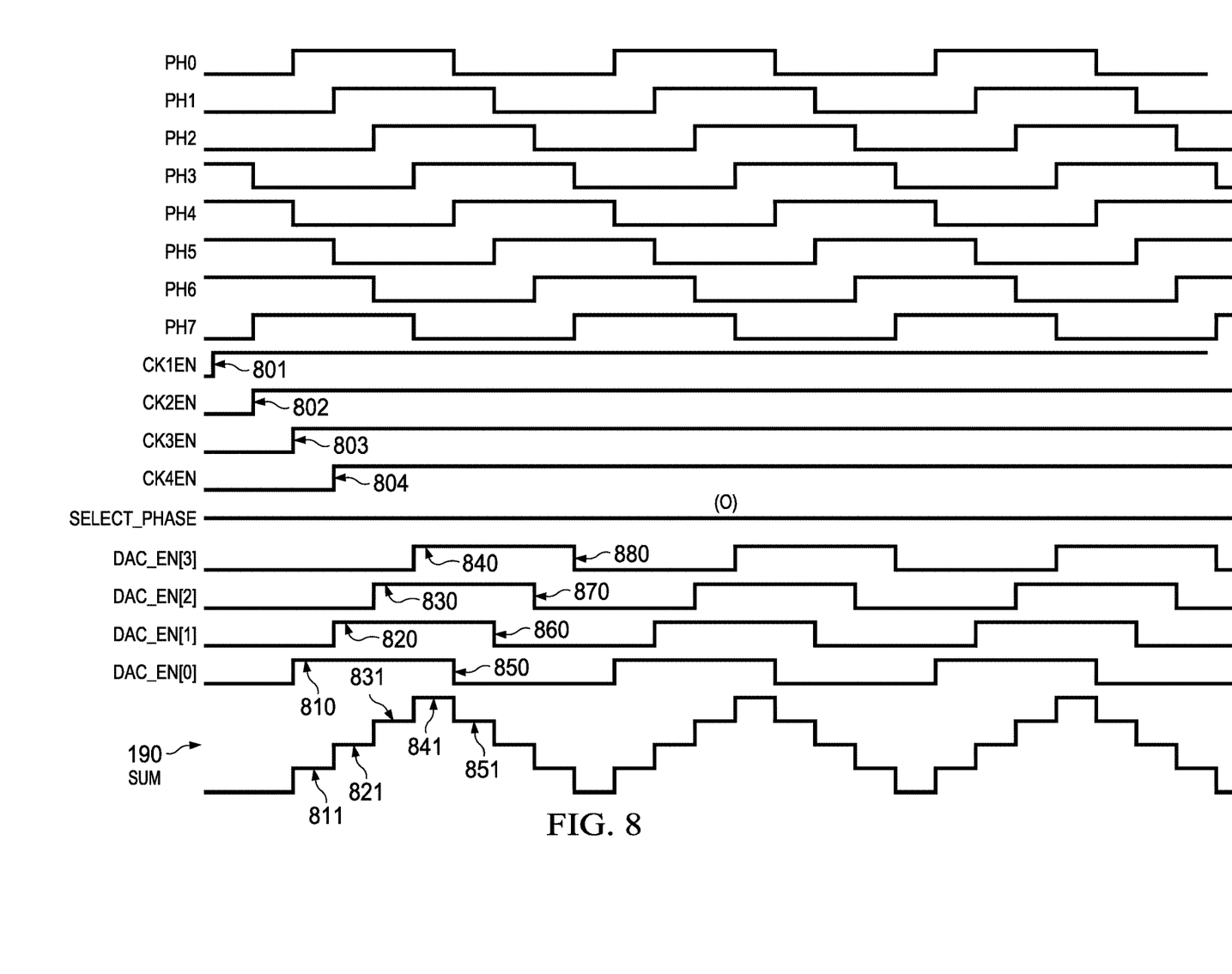
FIG. 8 shows illustrative waveforms of signals within the waveform synthesizer of FIG. 2.

The output signals from the Q outputs of latches 506, 505, 507, and 509 are CK1EN, CK2EN, CK3EN, and CK4EN, respectively. The propagation of the latched signals through the phase enable circuit 130 of FIG. 6 is such that the clock enable signals (CK1EN-CK4EN) are sequentially asserted in such a way to cause the IDACs to be sequenced to synthesize the desired periodic waveform. FIG. 8 (described below) provides a timing diagram to further illustrate the timing of the signals shown in FIG. 6.

Figure 7:
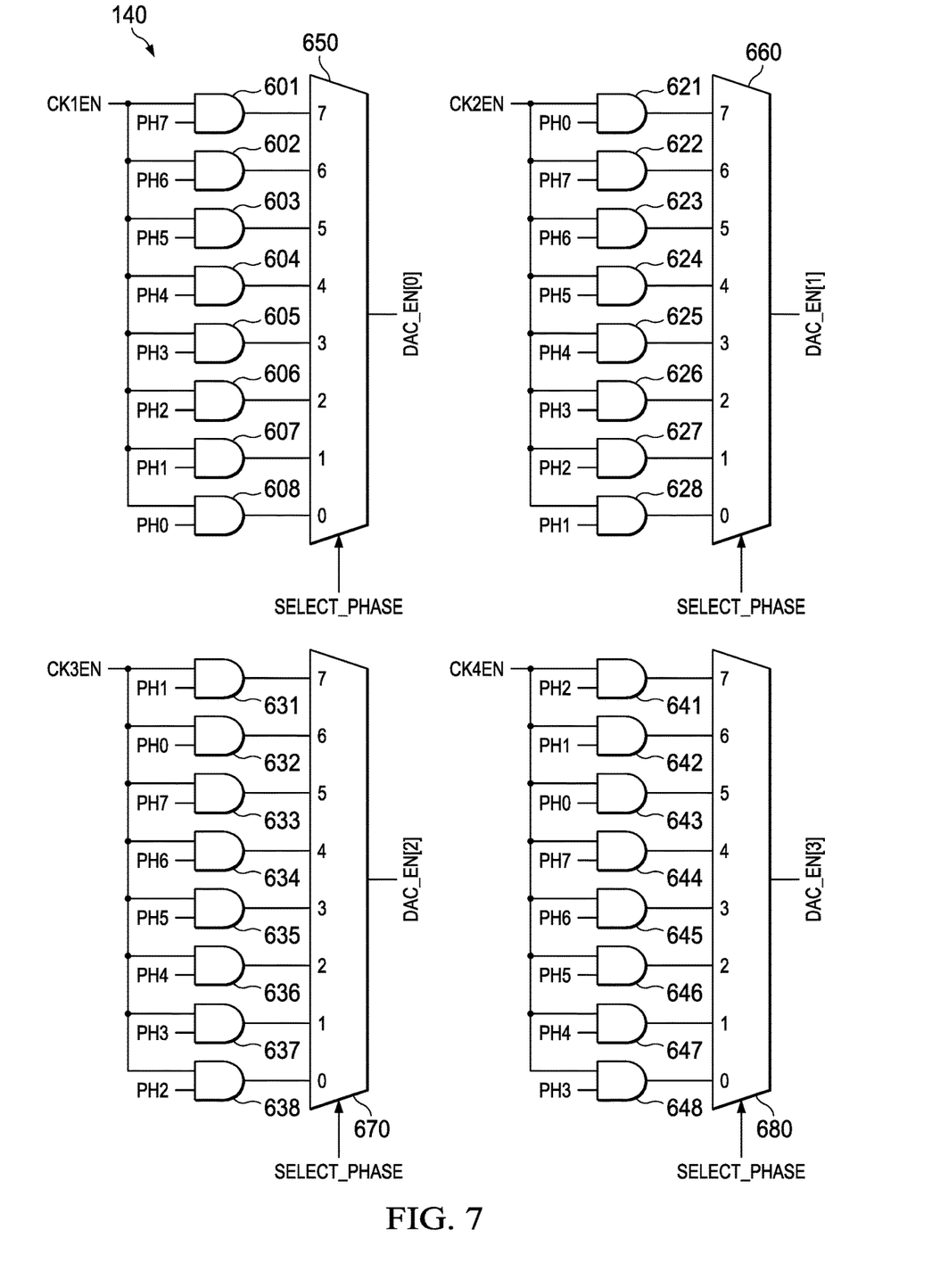
FIG. 7 shows an example of a digital-to-analog converter (DAC) enable circuit for use in the waveform synthesizer of FIG. 2.

FIG. 7 shows an example of DAC enable circuit 140. The DAC enable circuit 140 includes AND gates 601-608, 621-628, 631-638, and 641-648, as well as multiplexers 650, 660, 670, and 680. Each of AND gates 601-608 have inputs that receive CK1EN on one input and one of the phase signals on the other input. AND gate 601 logically ANDs together CK1EN and PH7. AND gate 602 logically ANDs together CK1EN and PH6. AND gates 603-608 ANDs together CK1EN and one of PH5, PH4, PH3, PH2, PH1, and PH0, as shown. The outputs of AND gates 601-608 are coupled to respective inputs of multiplexer 650. The output of AND gate 601 couples to input 7 of multiplexer 650, whereas the outputs of AND gates 602-608 are coupled to the respective inputs 6 through 0 of multiplexer 650 as shown. SELECT_PHASE also is coupled to the control inputs of multiplexer 650 (as well as to the control inputs of multiplexers 660-680) to select the corresponding input signal as the DAC_EN[0] output signal. Continuing the example above in which SELECT_PHASE is <000>, DAC_EN[0] will be equal to PH0 while CK1EN is asserted high. While CK1EN is low, DAC_EN[0] remains at 0.

The other multiplexers 660-680 are similarly configured but using a different clock enable signal and a different connection of the phase signals to the AND gates. AND gate 621 ANDs together CK2EN and PH0. AND gate 622 ANDs together CK2EN and PH7. AND gates 623-628 ANDs together CK2EN and one of PH6, PH5, PH4, PH3, PH2, and PH1, as shown. The outputs of AND gates 621-628 are coupled to respective inputs of multiplexer 660. The output of AND gate 621 couples to input 7 of multiplexer 660, whereas the outputs of AND gates 622-628 are coupled to the respective inputs 6 through 0 of multiplexer 660 as shown. The value of SELECT_PHASE causes multiplexer 660 to select the corresponding input signal as the DAC_EN[1] output signal. With SELECT_PHASE equal to <000>, for example, DAC_EN[1] will be equal to PH1 while CK2EN is asserted high. While CK2EN is low, DAC_EN[1] remains at 0.

AND gate 631 ANDs together CK3EN and PH1. AND gate 632 ANDs together CK3EN and PH0. AND gates 633-638 ANDs together CK3EN and one of PH7, PH6, PH5, PH4, PH3, and PH2, as shown. The outputs of AND gates 631-638 are coupled to respective inputs of multiplexer 670. The output of AND gate 631 couples to input 7 of multiplexer 670, whereas the outputs of AND gates 632-638 are coupled to the respective inputs 6 through 0 of multiplexer 670 as shown. The value of SELECT_PHASE causes multiplexer 670 to select the corresponding input signal as the DAC_EN[2] output signal. With SELECT_PHASE equal to <000>, for example, DAC_EN[2] will be equal to PH2 while CK3EN is asserted high. While CK3EN is low, DAC_EN[2] remains at 0.

AND gate 641 ANDs together CK4EN and PH2. AND gate 642 ANDs together CK4EN and PH1. AND gates 643-648 ANDs together CK4EN and one of PH0, PH7, PH6, PH5, PH4, and PH3, as shown. The outputs of AND gates 641-648 are coupled to respective inputs of multiplexer 680. The output of AND gate 641 couples to input 7 of multiplexer 680, whereas the outputs of AND gates 642-648 are coupled to the respective inputs 6 through 0 of multiplexer 680 as shown. The value of SELECT_PHASE causes multiplexer 680 to select the corresponding input signal as the DAC_EN[3] output signal. With SELECT_PHASE equal to <000>, for example, DAC_EN[3] will be equal to PH3 while CK4EN is asserted high. While CK4EN is low, DAC_EN[3] remains at 0.

FIG. 8 shows an example timing diagram for the following signals: PH0-PH7, CK1EN-CK4EN, DAC_EN[3] through DAC_EN[0], and SUM 190. SELECT_PHASE in this example is equal to <000>. The PH0-PH7 phase signals have the same frequency but are phase-delayed from each other as shown. The clock enable signals, CK1EN-CK4EN are asserted in a staggered fashion as shown at 801, 802, 803, and 804. With SELECT_PHASE equal to <000>, DAC_EN[0] through DAC_EN[3] are equal to PH0 through PH3, respectively, once their respective clock enable signals are asserted high. At 810, DAC_EN[0] is asserted high, while the other DAC_ENs are low. As such, at 810, only IDAC0 is enabled and SUM 190 at 811 is equal to the current produced by just IDAC0.

At 820, both DAC_EN[0] and DAC_EN[1] are asserted and thus both IDAC0 and IDAC1 are enabled to produce current. As a result, SUM jumps up to the level shown at 811, which equals the sum of the individual currents produced by IDAC0 and IDAC1. SUM jumps up again at 831 as DAC_EN[2] also is asserted at 830. Finally, at 840, all four DAC_EN signals are active high, and thus all four IDACs are enabled thereby producing the magnitude for SUM 190 shown at 841.

At 850, DAC_EN[0] becomes logic low and thus IDAC0 is disabled causing SUM to take a step down as shown at 851. SUM 190 continues to step down as each subsequent IDAC is disabled by its respective DAC_EN signal being forced low as shown at 860, 870, and 880. The process then repeats thereby synthesizing the desired waveform.

Figure 9:
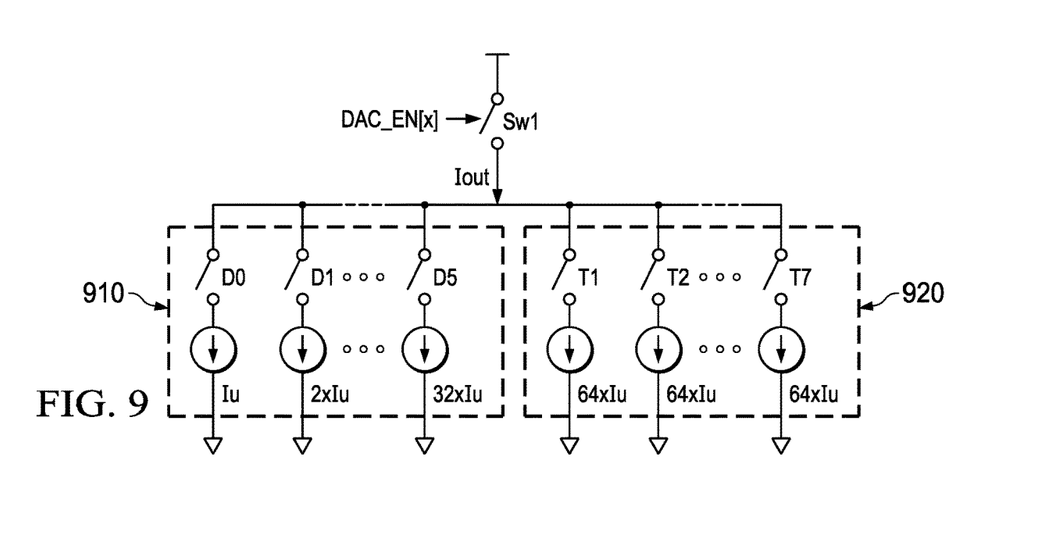
FIG. 9 shows an example of an IDAC for use in the waveform synthesizer of FIG. 2.

FIG. 9 shows an example implementation of each of the IDACs (IDAC0-IDAC3), In the example of FIG. 9, each IDAC includes a binary-weighted set 910 of current sources and a thermometric set 920 of current sources. The binary-weighted set 910 comprises a unit current source Iu and current sources that produce twice, four times, eight times, etc. the unit current. In the example of FIG. 9, the binary-weighted set 910 includes current sources that produce Iu, 2*Iu, 4*Iu, 8*Iu, 16*Iu, and 32*Iu. Each current source is coupled to a respective switch which is controlled by a respective bit of the digital code. In the example of FIG. 9, the six most significant bits of the digital code are used to control the switches within the binary-weighted set 910.

The remaining bits of the digital code are converted to a thermometric code which and used to control to switches within the thermometric set 920. The current sources within the thermometric set 920 are all weighted the same (e.g., 641u). The digital code provided to the input of the IDACs in FIG. 2 is thus used to control the switches shown in the example IDAC of FIG. 9 to produce a predetermined current from each IDAC, when that IDAC is enabled. Switch SW1 is controlled by the IDACs respective DAC_EN signal to enable and disable the IDAC.

Figure 10:
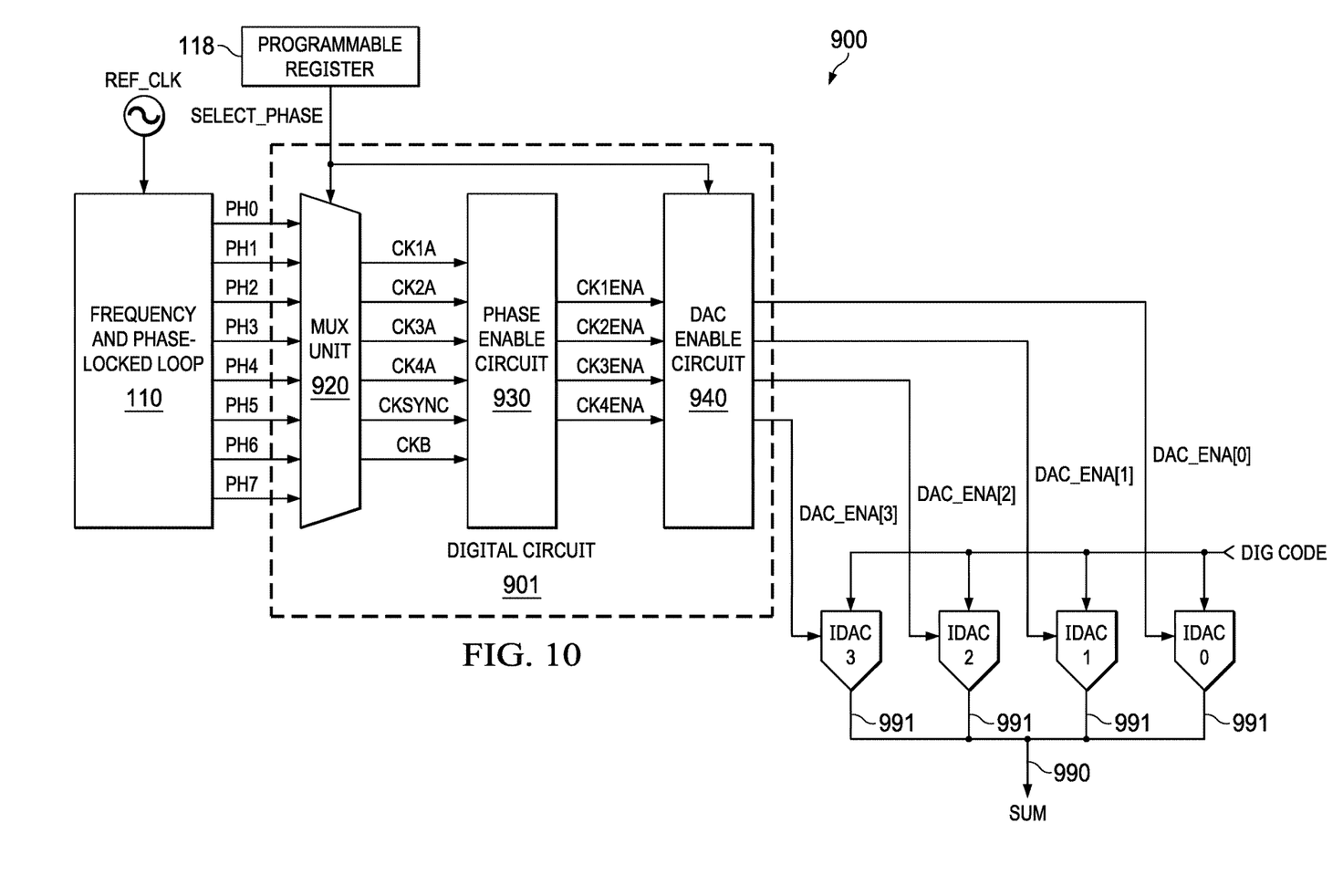
FIG. 10 shows another example of a waveform synthesizer including multiple IDACs.

FIG. 10 shows an example of a waveform synthesizer 900 similar to that of FIG. 2, but with additional signals generated by multiplexer unit 920. The example waveform synthesizer 900 of FIG. 10 includes the FPLL 110, a digital circuit 901 (comprising multiplexer unit 920, phase enable circuit 930, and DAC enable circuit 940), and current DACs (IDAC0 through IDAC3). The FPLL 110 may be implemented as shown in the examples of FIGS. 3 and 4.

While four IDACs are shown in the example of FIG. 10, other examples may have a different number of IDACs (e.g., two IDACs, three IDACs, eight IDACs, 16 IDACs, etc.). The outputs of the IDACs are coupled together to produce an output SUM signal 990. SUM 990 is a current whose magnitude is equal to the sum of the currents from the individual IDACs that are enabled at any given point in time.

Reference clock (REF_CLK) is coupled to the FPLL 110. The FPLL 110 generates multiple output clocks (phases). Similar to the example of FIG. 2, in the example of FIG. 10, the FPLL 110 produces eight phases labeled PH0-PH7. The eight phases are provided to corresponding inputs of multiplexer unit 920. The multiplexer unit 920 receives SELECT_PHASE signal from the programmable register 118. In response to SELECT_PHASE, the multiplexer unit 920 generates four output clocks (CLK1A-CLK4A), a CKSYNC signal, and a CKB signal. Each clock CLK1A-CLK4A is one of the eight input phases (PH0-PH7). CLK1A is selected to be a different phase than CLK2A, CLK2A is selected to be a different phase than CLK3A, and CLK3A is selected to be a different phase than CLK4A. A different one of the eight phases PH0-PH7 is used to provide each of CLK1A, CLK2A, CLK3A, and CLK4A, as will be described below. CKSYNC also is selected as one of the phase signals, as is the case for CKB. The phase selected for CKSYNC is different than the phase selected for CKB. Selecting different phases to enable each IDAC controls the delay of the synthesized waveform.

The inputs of the phase enable circuit 930 are coupled to the outputs of the multiplexer unit 920, and thus the phase enable circuit 930 receives CLK1A-CLK4A, CKSYNC, and CKB. The phase enable circuit 930 uses the CLK1A-CLK4A, CKSYNC, and CKB signals to generate clock enable signals (CLK1ENA-CLK4ENA) to the DAC enable circuit 140. The DAC enable circuit 940 receives the CLK1ENA-CLK4ENA signals and uses those signals to generate a separate enable signal DAC_EN to each of the IDACs. The DAC enable circuit 940 generates DAC_ENA[0], DAC_ENA[1], DAC_ENA[2], and DAC_ENA[3] for each IDAC0-IDAC3, respectively, as shown. A digital code (DIG CODE) is provided to the digital input of each IDAC, and thus each IDAC is configured to generate the same output current as the other IDACs. The outputs 991 of the IDACs are connected together, and thus the output currents are summed together from whichever IDACs are enabled at any given time to produce SUM 990. By sequencing when each IDAC is enabled, a multi-step waveform can be created to simulate a periodic waveform.

Figure 11:
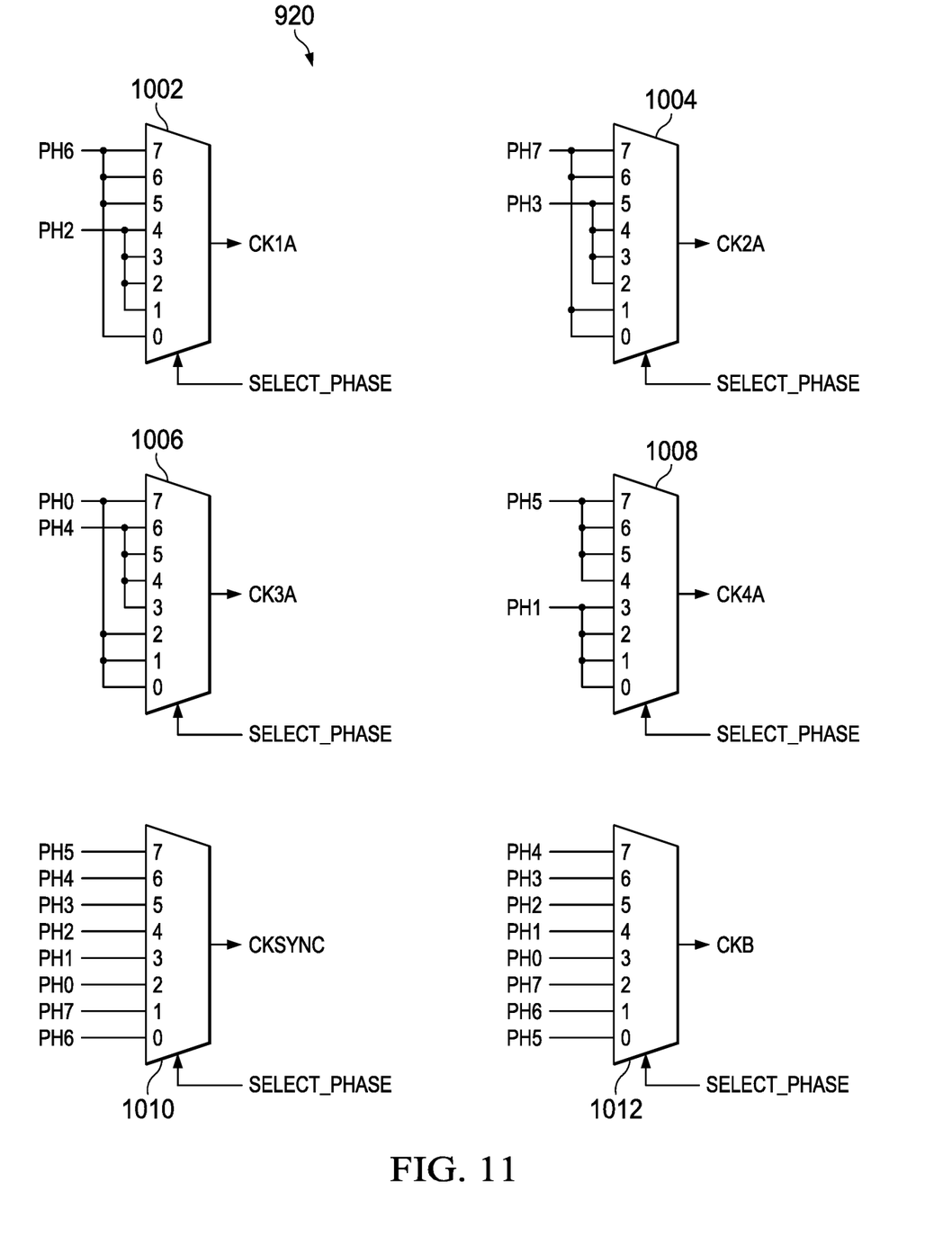
FIG. 11 shows an example of a multiplexer for use in the waveform synthesizer of FIG. 10.

FIG. 11 shows an example of multiplexer unit 920. Multiplexer unit 920 comprises six multiplexers 1002, 1004, 1006, and 1008. Each multiplexer 1002-1008 includes inputs labeled 0 through 7. Multiplexer 1010, which produces CKSYNC, is coupled to receive all of the phase signals PH0-PH7. Similarly, multiplexer 1012, which produces CKB, is coupled to receive all of the phase signals PH0-PH7. Each input 0-7 of multiplexer 1010 receives a different phase signal than the corresponding input 0-7 of multiplexer 1012. Inputs 0 and 1 of multiplexer 1010 receives PH6 and PH7, respectively, and inputs 2-7 receives PH0-PH5, respectively. Inputs 0-2 of multiplexer 1012 receives PH6-PH7, respectively, and inputs 3-7 receives PH0-PH4, respectively.

Multiplexers 1002, 1004, 1006, and 1104 generate CK1A, CK2A, CK3A, and CK4A, respectively. The collective inputs of multiplexers 1002-1008 receive two of the phase signals, as shown. Inputs 1-4 of multiplexer 1002 receive PH2, and inputs 0 and 5-7 receive PH6. Inputs 2-5 of multiplexer 1004 receive PH3, and inputs 0, 1, 6, and 7 receive PH7. Inputs 3-6 of multiplexer 1006 receive PH4, and inputs 0-3, 6, and 7 receive PH0. Inputs 0-3 of multiplexer 1008 receives PH1, and inputs 4-7 receive PH5.

Each of the six multiplexers 1002-1012 receives the same control signal, SELECT_PHASE and thus the same input of each multiplexer is selected to provide its signal as the output signal. For example, if SELECT_PHASE is <101> (decimal 5), then CK1A will be PH6, CK2A will be PH3, CK3A will be PH4, CK4A will be PH5, CKSYNC will be PH3, and CKB will be PH2.

Figure 12:
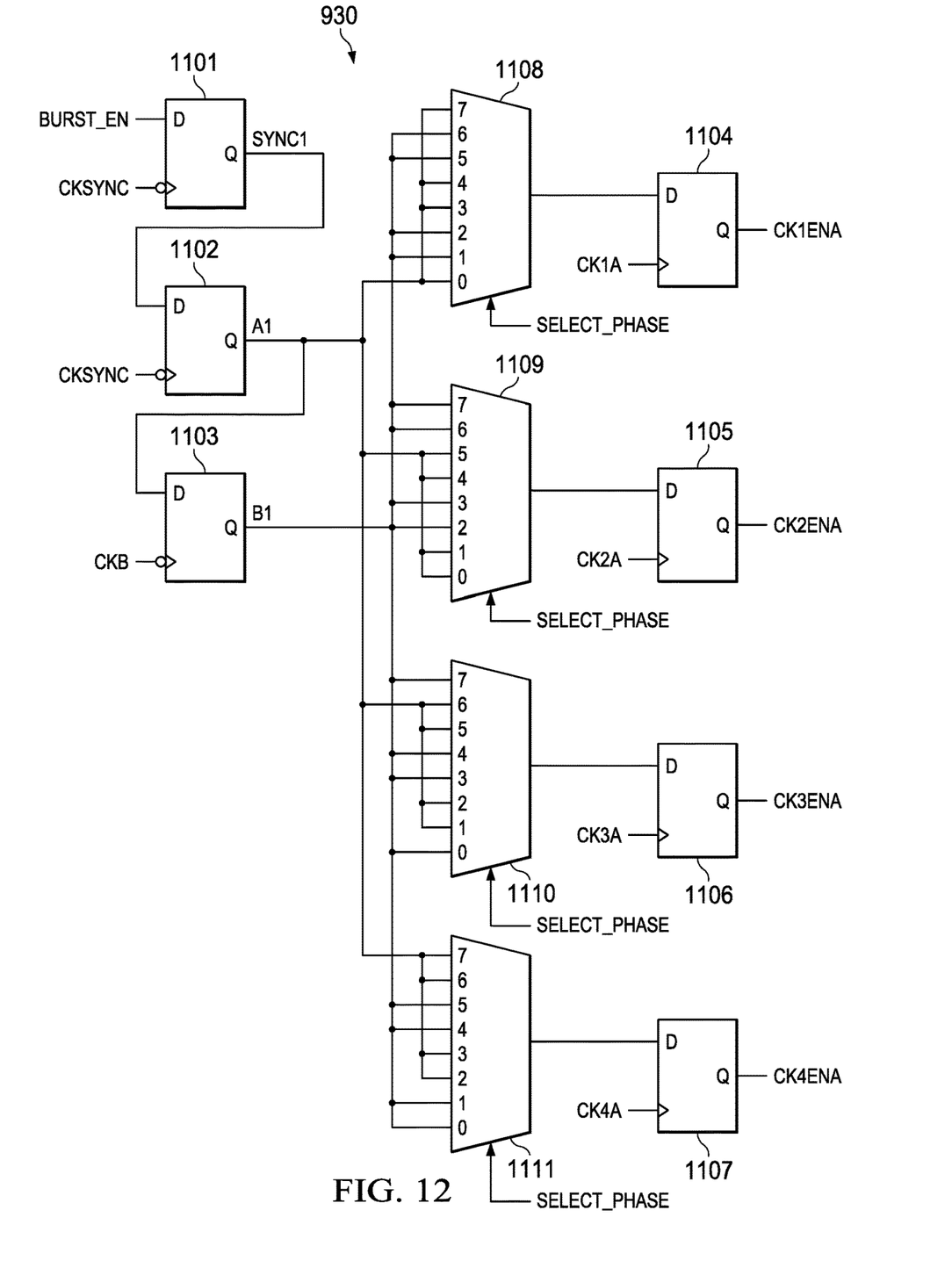
FIG. 12 shows an example of a phase enable circuit for use in the waveform synthesizer of FIG. 10.

FIG. 12 shows an example of phase enable circuit 930. Phase enable circuit 930 in this example includes latches 1101 through 1107, and multiplexers 1108-1111. Each latch includes a data (D) input, a clock input, and an output (Q). The clock inputs of latches 1101 and 1102 are inverted, and the clock inputs of the remaining latches are positive. The D input of latch 1101 receives the BURST_EN signal and its clock input receives CKSYNC. The output of latch 1101 produces a signal labeled as SYNC1 and is coupled to the D input of latch 1102. Latch 1102 is clocked by CKSYNC, and the output signal from latch 1102 is A1. The output from latch 1102 is coupled to the D input of latch 1103. The output from latch 1102 also is coupled to inputs 0, 3, 4, and 7 of multiplexer 1108, to inputs 0, 1, 4, and 5 of multiplexer 1109, to inputs 1, 2, 5, and 6 of multiplexer 1110, and to inputs 2, 3, 6, and 7 of multiplexer 1111.

Latch 1103 is clocked by CKB, and its output provides signal B1 and is coupled to inputs 1, 2, 5, and 6 of multiplexer 1108, to inputs 2, 3, 6, and 7 of multiplexer 1109, to inputs 0, 3, 4, and 7 of multiplexer 1110, and to inputs 0, 1, 4, and 5 of multiplexer 1111. SELECT_PHASE is provided to each of multiplexers 1108-1111 to select the same input from each multiplexer to provide the corresponding output signa. For example, if SELECT_PHASE is <101>, the output signals from multiplexers 1108-1111 will be B1, A1, A1, and B1, respectively.

The output of multiplexer 1108 is coupled to the D input of latch 1104. The output of multiplexer 1109 is coupled to the D input of latch 1105. The output of multiplexer 1110 is coupled to the D input of latch 1106. The output of multiplexer 1111 is coupled to the D input of latch 1107. CK1A is provided to the clock input of latch 1104. CK2A is provided to the clock input of latch 1105. CK3A is provided to the clock input of latch 1106. CK4A is provided to the clock input of latch 1107. CK1ENA, CK2ENA, CK3ENA, and CK4ENA are the output signals of latches 1104-1007, respectively, as shown.

Figure 13:
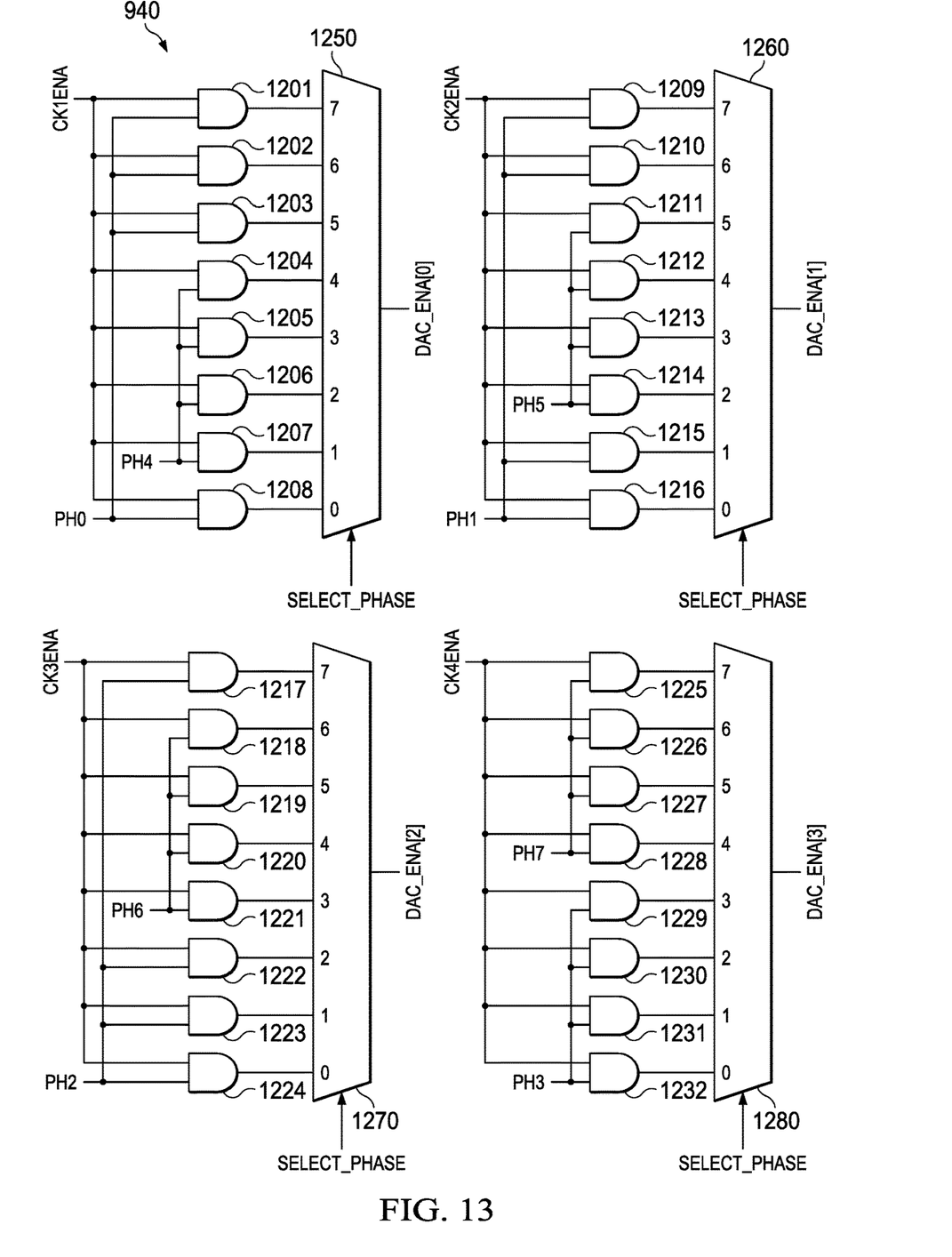
FIG. 13 shows an example of a DAC enable circuit for use in the waveform synthesizer of FIG. 10.

FIG. 13 shows an example of the DAC enable circuit 940 of FIG. 10. The DAC enable circuit 940 includes AND gates 1201-1232, as well as multiplexers 1250, 1260, 1270, and 1280. Each of AND gates 1201-1208 have inputs that receive CK1ENA on one input and one of the phase signals on the other input. AND gates 1201-1203 and 1208 logically AND together CK1ENA and PH0. As such, the output signals from AND gates 1201-1203 and 1208 are the same. AND gates 1204-1207 AND together CK1ENA and PH4. The outputs of AND gates 1201-1203 and 1208 are coupled to the inputs 7, 6, 5 and 0, respectively, of multiplexer 1250. The outputs of AND gates 1204-1207 are coupled to the inputs 4, 3, 2 and 1, respectively, of multiplexer 1250.

AND gates 1209, 1210, 1215 and 1216 AND together CK2ENA and PH1. AND gates 1211-1214 AND together CK2ENA and PH5. The outputs of AND gates 1209, 1210, 1215 and 1216 are coupled to the inputs 7, 6, 1 and 0, respectively, of multiplexer 1260. The outputs of AND gates 1211-1214 are coupled to the inputs 5, 4, 3, and 2, respectively, of multiplexer 1260.

AND gates 1219 and 1222-1224 AND together CK3ENA and PH2. AND gates 1218-1221 AND together CK3ENA and PH6. The outputs of AND gates 1219 and 1222-1224 are coupled to the inputs 7, 2, 1 and 0, respectively, of multiplexer 1270. The outputs of AND gates 1218-1221 are coupled to the inputs 6, 5, 4, and 3, respectively, of multiplexer 1270.

AND gates 1225-1228 AND together CK4ENA and PH7. AND gates 1229-1232 AND together CK4ENA and PH3. The outputs of AND gates 1225-1228 are coupled to the inputs 7, 6, 5 and 4, respectively, of multiplexer 1280. The outputs of AND gates 1229-1232 are coupled to the inputs 3, 2, 1, and 0, respectively, of multiplexer 1280.

SELECT_PHASE is the control signal for the multiplexers 1250-1280. The output signal from multiplexer 1250 is DAC_ENA[0]. The output signal from multiplexer 1260 is DAC_ENA[1]. The output signal from multiplexer 1270 is DAC_ENA[2]. The output signal from multiplexer 1280 is DAC_ENA[3].

Figure 14:
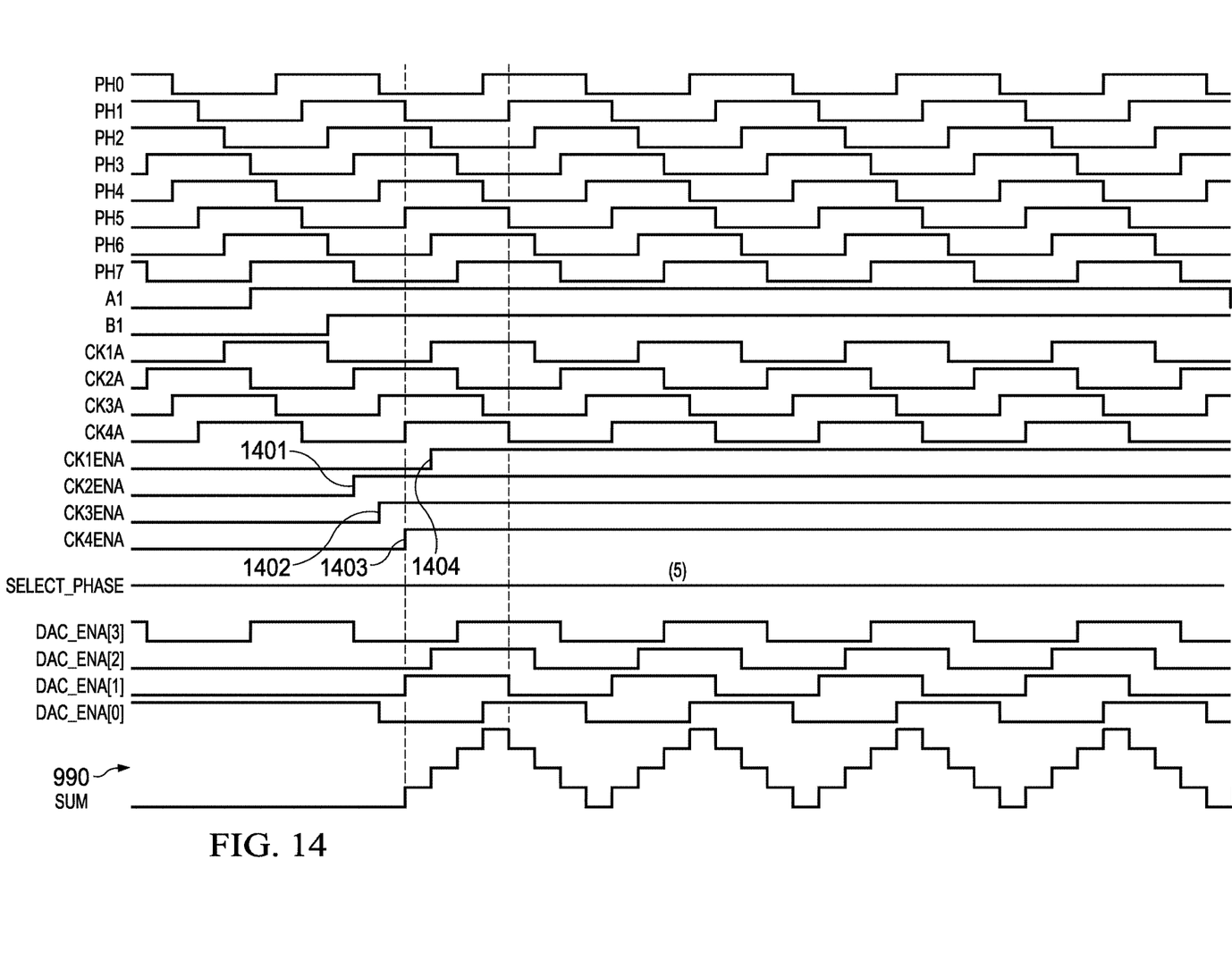
FIG. 14 shows illustrative waveforms of signals within the waveform synthesizer of FIG. 10.

FIG. 14 shows an example timing diagram for the following signals: PH0-PH7, A1, B1, CK1A-CK3A, CK1ENA-CK4ENA, DAC_ENA[3] through DAC_ENA[0], and SUM 990. SELECT_PHASE in this example is equal to <101>. The PH0-PH7 phase signals have the same frequency but are phase-delayed from each other as shown. With SELECT_PHASE equal to <101>, CK1A is selected by multiplexer 1002 to be PH6. Similarly, CK2A, CK3A, and CK4A are selected by their respective multiplexers 1004-1008 to be PH3, PH4, and PH5, respectively, as shown.

The clock enable signals, CK1ENA-CK4ENA are asserted in a staggered fashion with CK2ENA leading followed subsequently by CK3ENA, CK4ENA, and CK1ENA as shown at 1401, 1402, 1403, and 1404. The DAC enable signals are also illustrated in FIG. 14 for SELECT_PHASE equal to <101>. DAC_ENA[0] through DAC_ENA[3] are equal to PH5, PH6, PH7, and PH0, respectively, once their respective clock enable signals (CK1ENA-CK4ENA) are asserted high. SUM 990 also is illustrated as the various IDACs are turned on and off pursuant to their respective DAC enable signals. As is illustrated with the DAC enable waveforms, each IDAC is clocked at the same frequency as the waveform (SUM 990) being synthesized, and thus advantageously not significantly faster than the frequency of SUM 990.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit comprising:
a phase-locked loop;
a digital circuit including:
a multiplexer unit coupled to the phase-locked loop;
a digital-to-analog converter (DAC) enable circuit; and
a phase enable circuit coupled between the multiplexer unit and the DAC enable circuit;
a first DAC coupled to the DAC enable circuit; and
a second DAC coupled to the DAC enable circuit.

2. The circuit of claim 1, wherein the first DAC is configured to receive a first DAC enable signal from the DAC enable circuit and generate a first portion of a periodic waveform, and the second DAC is configured to receive a second DAC enable signal from the DAC enable circuit and generate a second portion of the periodic waveform.

3. The circuit of claim 1, wherein the phase-locked loop is configured to generate phase signals that are phase delayed relative to each other, and the multiplexer unit includes first and second multiplexers each configured to receive all the phase signals.

4. The circuit of claim 1, wherein the phase-locked loop is configured to generate phase signals that are phase delayed relative to each other, and the multiplexer unit includes first and second multiplexers each configured to receive only some of the phase signals.

5. The circuit of claim 1, wherein the multiplexer unit includes first and second multiplexers each having a respective output, and wherein the phase enable circuit includes:
a first flip-flop having a respective clock input coupled to the output of the first multiplexer; and
a second flip-flop having a respective clock input coupled to the output of the second multiplexer.

6. The circuit of claim 5, wherein the first and second flip-flops each have a respective clock enable output, and the DAC enable circuit includes:
first logic gates having respective first inputs and second inputs, wherein the first inputs are coupled to the clock enable output of the first flip flop, and the second inputs are decoupled from each other; and
second logic gates having respective first inputs and second inputs, wherein the first inputs of the second logic gates are coupled to the clock enable output of the second flip flop, and the second inputs of the second logic gates are decoupled from each other.

7. The circuit of claim 1, wherein the first DAC includes a first current DAC having an output and the second DAC includes a second current DAC having an output, and wherein the respective outputs of the first and second current DACs are coupled together.

8. The circuit of claim 5, wherein the first and second flip-flops each have a respective clock enable output, and the DAC enable circuit includes:
first logic gates having respective first inputs and second inputs, wherein the first inputs are coupled to the clock enable output of the first flip flop, a first plurality of the second inputs are coupled together, and a second plurality of the second inputs are coupled together and decoupled from the first plurality of the second inputs; and
second logic gates having respective third inputs and fourth inputs, wherein the third inputs are coupled to the clock enable output of the second flip flop, a first plurality of the fourth inputs are coupled together, and a second plurality of the fourth inputs are coupled together and decoupled from the first plurality of the fourth inputs.

9. A circuit comprising:
a phase-locked loop configured to provide first through eighth phase signals that are phased delayed with respect to each other;
a digital circuit coupled to the phase-locked loop, the digital circuit is configured to receive the first through eighth phase signals and generate first, second, third, and fourth enable signals using the first through eighth phase signals;
a first DAC coupled to the digital circuit, the first DAC is configured to receive the first enable signal;
a second DAC coupled to the digital circuit, the second DAC is configured to receive the second enable signal;
a third DAC coupled to the digital circuit, the third DAC is configured to receive the third enable signal; and
a fourth DAC coupled to the digital circuit, the fourth DAC is configured to receive the fourth enable signal.

10. The circuit of claim 9, wherein the digital circuit includes a first multiplexer, a second multiplexer, a third multiplexer, and a fourth multiplexer each coupled to the phase-locked loop, wherein each of the first through fourth multiplexers is configured to receive the first through eighth phase signals.

11. The circuit of claim 10, wherein each of the first through fourth multiplexers is configured to receive a same control signal.

12. The circuit of claim 10, wherein each of the first through fourth multiplexers has a respective output, and the digital circuit further includes:
a first flip-having a respective clock input coupled to the output of the first multiplexer;
a second flip-having a respective clock input coupled to the output of the second multiplexer;
a third flip-having a respective clock input coupled to the output of the third multiplexer; and
a fourth flip-having a respective clock input coupled to the output of the fourth multiplexer.

13. The circuit of claim 9, wherein the first through fourth DACs each includes a respective current DAC having a respective output, and the respective outputs are coupled together.

14. The circuit of claim 9, wherein each of the first through fourth DACs is configured to receive a same digital code and generate a respective current responsive to the digital code.

15. The circuit of claim 9, wherein the phase-locked loop comprises a ring oscillator.

16. The circuit of claim 9, wherein the first through fourth DACs are configured to collectively generate a periodic waveform having a frequency, and each of the first through fourth DACs is configured to be clocked at a same frequency as the frequency of the periodic waveform.

17. A circuit comprising:
a phase-locked loop (PLL) having N number of PLL outputs, where N is an even-numbered integer greater than 2;
N÷2 number of current digital to analog converters (iDACs), each iDAC having a respective iDAC input and a respective iDAC output, the iDAC outputs coupled together; and
a digital circuit coupled to the N PLL outputs, the digital circuit having N÷2 number of digital circuit outputs, each digital circuit output coupled to a different one of the respective iDAC inputs, the digital circuit configured to receive N phase-shifted clock signals from the PLL and provide a different one of the phase-shifted clock signals at each of the digital circuit outputs.

18. The circuit of claim 17, the digital circuit including:
a first multiplexer having a first set of N multiplexer inputs, each multiplexer input in the first set coupled to a different one of the PLL outputs; and
a second multiplexer having a second set of N multiplexer inputs, each multiplexer input in the second set coupled to a different one of the PLL outputs.

19. The circuit of claim 18, the digital circuit further including:
logic gates;
a third multiplexer having a third set of N multiplexer inputs, each multiplexer input in the third set coupled to a different one of the PLL outputs through a respective one of the logic gates; and
a fourth multiplexer having a fourth set of N multiplexer inputs, each multiplexer input in the fourth set coupled to a different one of the PLL outputs through a respective one of the logic gates.

20. The circuit of claim 19, wherein the logic gates include AND gates.

21. The circuit of claim 17, the digital circuit including:
a first multiplexer having a first set of N multiplexer inputs, some of the multiplexer inputs in the first set coupled to a first PLL output of the PLL outputs, and others of the multiplexer inputs in the first set coupled to a second PLL output of the PLL outputs; and
a second multiplexer having a second set of N multiplexer inputs, some of the multiplexer inputs in the second set coupled to a third PLL output of the PLL outputs, and others of the multiplexer inputs in the second set coupled to a fourth PLL output of the PLL outputs.

22. The circuit of claim 21, the digital circuit including:
a third multiplexer having a third set of N multiplexer inputs, each multiplexer input in the third set coupled to a different one of the PLL outputs; and
a fourth multiplexer having a fourth set of N multiplexer inputs, each multiplexer input in the fourth set coupled to a different one of the PLL outputs.

23. The circuit of claim 21, the digital circuit further including:
logic gates;
a third multiplexer having a third set of N multiplexer inputs, some of the multiplexer inputs in the third set coupled to the first PLL output through a respective one of the logic gates, and others of the multiplexer inputs in the third set coupled to the second PLL output through a respective one of the logic gates; and
a fourth multiplexer having a fourth set of N multiplexer inputs, some of the multiplexer inputs in the fourth set coupled to the third PLL output through a respective one of the logic gates, and others of the multiplexer inputs in the fourth set coupled to the fourth PLL output through a respective one of the logic gates.

24. The circuit of claim 23, wherein the logic gates include AND gates.

25. The circuit of claim 17, wherein N=8.

26. The circuit of claim 17, wherein the digital circuit is configured to operate at a frequency of a signal at the iDAC outputs.

* * * * *